United States Patent
Rieger (10) Patent No.: US 7,076,700 B2
(45) Date of Patent: Jul. 11, 2006

(54) METHOD FOR RECONFIGURING A MEMORY

(75) Inventor: Martin Rieger, München (DE)

(73) Assignee: Infineon Technologies AG, Munich (DE)

(*) Notice: Subject to any disclaimer, the term of this patent is extended or adjusted under 35 U.S.C. 154(b) by 386 days.

(21) Appl. No.: 10/288,911

(22) Filed: Nov. 6, 2002

(65) Prior Publication Data

US 2003/0101389 A1    May 29, 2003

(30) Foreign Application Priority Data

Nov. 12, 2001 (DE) ................. 101 55 449

(51) Int. Cl.
*G11C 29/00* (2006.01)
(52) U.S. Cl. ............ 714/710; 714/25; 365/225.7
(58) Field of Classification Search ........... 714/710, 714/711, 25, 723; 365/200, 201, 225.7
See application file for complete search history.

(56) References Cited

U.S. PATENT DOCUMENTS

| | | | | |
|---|---|---|---|---|
| 5,457,655 A | * | 10/1995 | Savignac et al. | 365/200 |
| 5,491,664 A | * | 2/1996 | Phelan | 365/200 |
| 5,894,441 A | | 4/1999 | Nakazawa | |
| 6,067,259 A | * | 5/2000 | Handa et al. | 365/200 |
| 6,144,593 A | * | 11/2000 | Cowles et al. | 365/200 |
| 6,208,568 B1 | * | 3/2001 | Zagar et al. | 365/200 |
| 6,259,639 B1 | * | 7/2001 | Hashizume | 365/201 |
| 6,307,795 B1 | * | 10/2001 | Blodgett | 365/200 |
| 6,324,088 B1 | * | 11/2001 | Keeth et al. | 365/51 |
| 6,466,493 B1 | * | 10/2002 | Menke et al. | 365/200 |
| 6,498,756 B1 | * | 12/2002 | Lee | 365/200 |
| 2002/0108073 A1 | * | 8/2002 | Hughes | 714/7 |
| 2003/0028710 A1 | * | 2/2003 | Shinohara et al. | 711/104 |
| 2003/0084370 A1 | * | 5/2003 | Shore | 714/8 |

FOREIGN PATENT DOCUMENTS

WO    WO 9954819 A1 *   10/1999

OTHER PUBLICATIONS

Chin-Long Wey et al.: "On the Repair of Redundant RAM's", *IEEE Transactions on Computer-Aided Design*, vol. CAD-6, No. 2, Mar. 1987, pp. 222-231.

* cited by examiner

*Primary Examiner*—Albert Decady
*Assistant Examiner*—John P. Trimmings
(74) *Attorney, Agent, or Firm*—Laurence A. Greenberg; Werner H. Stemer; Ralph E. Locher (57) ABSTRACT

Faulty memory cells in a plurality of memory blocks are replaced by redundant memory cells. Each block includes plurality of first and second redundant address lines with assigned memory cells. The first redundant address lines of a block can be used in at least one other memory block. A fault image is determined and the memory is reconfigured so as to replace faulty memory cells. If one or more first redundant address lines with faulty memory cells have been displaced from one block to another block, the displaced first redundant address line with faulty memory cells is assigned to the other block. It is then determined whether the fault image is covered by the reconfiguration taking account of the assignment. If the fault image is covered, the reconfiguration is output as a valid solution.

9 Claims, 11 Drawing Sheets

FIG 1

PRIOR ART

FIG 2

PRIOR ART

METHOD FOR RECONFIGURING A MEMORY

BACKGROUND OF THE INVENTION

1. Field of the Invention

The present invention refers to a method for reconfiguring a memory so as to replace faulty memory cells by non-faulty memory cells in the memory. In particular the present invention refers to a method employing a reconfigurable memory comprising one or more regular (non-redundant) regions with a plurality of memory cells and redundant regions with a plurality of redundant memory cells, the regular regions having a plurality of address lines with assigned memory cells and the redundant regions having a plurality of redundant address lines with assigned memory cells.

2. Description of the Related Art

Modern dynamic semiconductor memories, DRAMs (DRAM=dynamic random access memory=dynamic memory with random access) are all provided with redundant memory cells so as to be able to replace memory cells which are found to be defective during a test run by non-defective functional memory cells. Only so is it possible to produce functional elements or components for new products. A further consequence is that in the case of more mature products there is a dramatic increase in the yield in the manufacture of such products.

Replacement of the memory cells does not take place individually, however, but by means of a readdressing of complete rows or columns of a cell matrix. Boundary conditions as regards the block formation in the replacement regions and the number of redundant rows and columns which are there available must be taken into account here. The attempt to achieve complete coverage, the so-called redundancy analysis, becomes a complicated optimization exercise for complex fault images.

There are no closed solutions in terms of formulae for discovering complete coverage of a given fault image through redundant rows and columns in a memory cell field organized in the form of a matrix. The search for a solution takes the form of checking various reconfigurations, the search being complete if it includes all the theoretically possible reconfigurations. To be efficient, those of the possible reconfigurations which probably provide coverage must be recognized quickly, and the checking sequence must be ordered according to these probabilities. In this way it is possible to reduce astronomically large numbers to just a few actual trial steps in practical cases. Such methods are generally known and do not represent the subject matter of the present invention. These methods are described for example by Chin-Long Wey et al. in IEEE Transactions on Computer Aided Design, Vol. 6, pp. 222–231, 1987.

Figure 1:
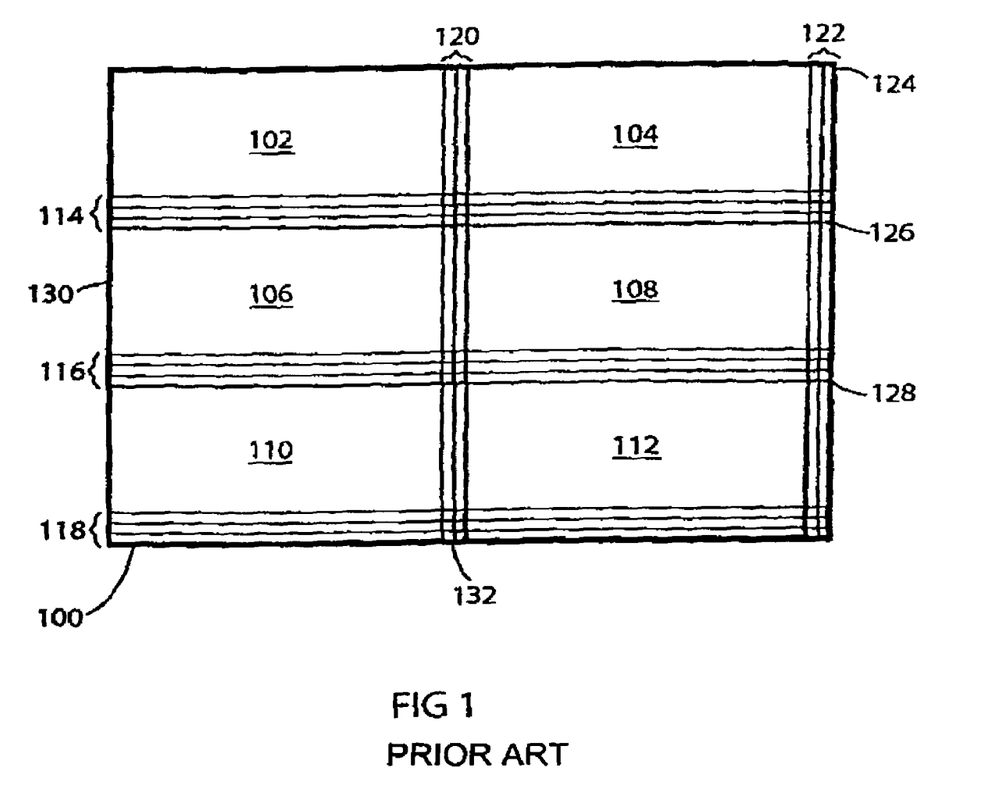
FIG. 1 shows a matrix-shaped memory cell field of a memory with a traditional block-oriented redundancy.

FIG. 1 shows an example of a matrix-shaped memory cell element of a memory with traditional block-oriented (segmented) redundancy.

The matrix-shaped memory cell field 100 comprises six blocks 102, 104, 106, 108, 110, 112. In each of the blocks 102 to 112 a plurality of individual memory cells is arranged in the form of a matrix; these are addressable via address lines, not shown in FIG. 1, consisting of word lines and bit lines, i.e. they can be called up and activated so as to permit data to be written into them or retrieved from them. In addition each of the blocks 102 to 112 includes three redundant row/word lines 114, 116, 118. Furthermore, each block 102 to 112 includes two redundant column/bit lines 120, 122.

The matrix-shaped memory cell field 100 shown in FIG. 1 possesses traditional block-oriented redundancy. The memory cell field 100 is subdivided into three row blocks, formed by the blocks 102 and 104, 106 and 108, and 110 and 112. The redundant row/word lines 114, 116 and 118 are assigned to the three row blocks. The memory cell field 100 is further subdivided into two column blocks, formed by the blocks 102, 106, 110 and 104, 108, 112.

The redundant word lines 114, 116, 118 can be used in the vertical direction up to the next block boundary 124, 126, 128. In other words, the redundant word lines 114 can be used in the blocks 102 and 104, i.e. in the first row block. Analogously, the redundant word lines 116 and 118 can be used in the row blocks 106, 108 and 110, 112 respectively.

The redundant bit lines 120, 122 can be used in the horizontal direction up to the block boundaries 130 and 132, the redundant bit lines 120 up to the block boundary 130 for the block 102, the block 106 and the block 110, therefore. Analogously, the redundant bit lines 122 can be used for the blocks 104, 108 and 112.

Of decisive importance in the use of the matrix-shaped memory cell field with traditional block-oriented redundancy, described in terms of FIG. 1, and employing a traditional redundancy analyzer is that in the replacement direction of a line type, i.e. of a word line or a bit line, no block boundaries 124 to 132 of the orthogonal line type are transgressed. In the prior art redundancy analyzers are known which reliably find solutions for redundancy architectures wherein the blocks in one direction of the cell matrix completely span one or more blocks in the orthogonal direction, as has just been explained with reference to FIG. 1.

In addition to the memory cell fields with traditional block-oriented redundancy just described, more flexible, so-called blockfree redundancy architectures exist, which offer advantages as regards space needed and the highest possible yield for reparable elements over the approach described in terms of FIG. 1. Such architectures contravene the block formation criterion described in terms of FIG. 1, so that with redundancy analyzers according to the prior art complete fault coverage can no longer be found, even if it exists, for every fault image. The reason for this is that if redundant lines are themselves faulty, the effective fault image is changed by the solution.

Figure 2:
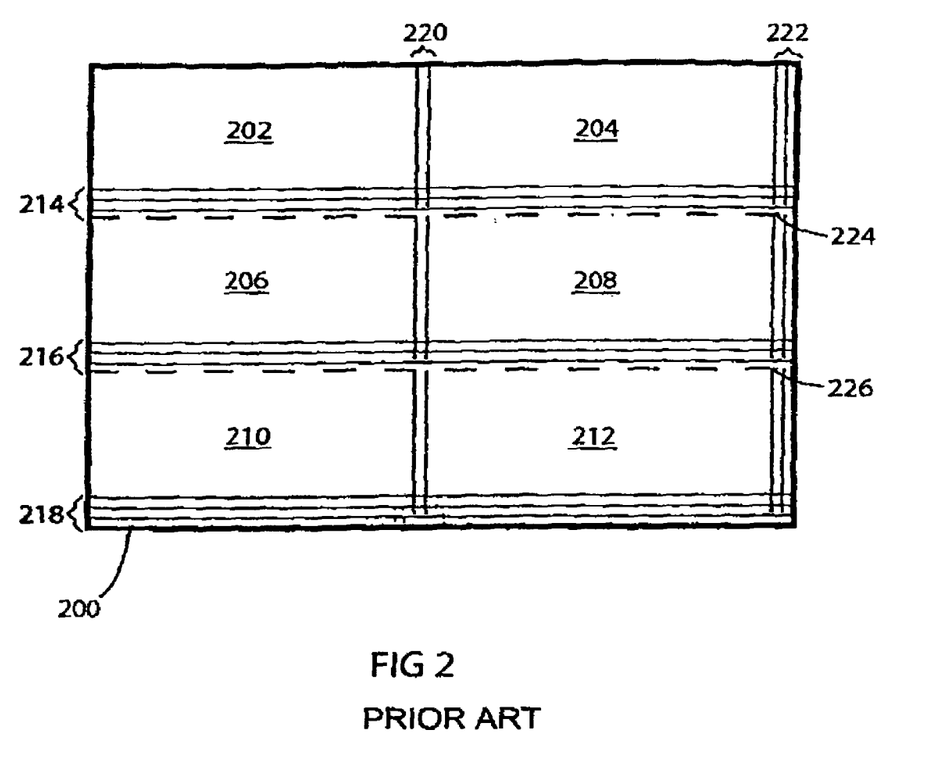
FIG. 2 shows a matrix-shaped memory cell field of a memory with a blockfree row redundancy.

The blockfree redundancy architecture will now be explained in more detail with reference to FIG. 2, which shows a matrix-shaped memory cell field 200 with a plurality of blocks 202 to 212 wherein the memory cells of the memory cell field are arranged, address lines (not shown) being assigned to the memory cells. Similarly to the situation in FIG. 1, the memory cell field 200 has a plurality of redundant word lines 214 to 218 and a plurality of redundant bit lines 220 and 222. Block formation for the redundant column/bit lines 220, 222 is indicated by the broken lines 224 and 226. The redundant column/bit lines 220, 222 can be used freely in the horizontal direction at independent addresses in the various blocks, as is indicted schematically by representing the bit lines 220, 222 as interrupted lines. The matrix-shaped memory cell field 200 is formed according to blockfree redundancy, meaning that all nine redundant row/word lines 214 to 218 are freely used in the vertical direction.

The method used for a reconfiguration for replacing faulty memory cells in a memory according to the prior art will now be described in more detail making reference to FIGS. 3A and 3B. According to the present invention, reconfiguration means the readdressing of valid row and column addresses of the regular region of the memory into the redundant region of the memory.

In a first step S300 the memory/memory cell field (including redundant regions) is examined so as to determine faulty memory cells in the memory/memory cell field 200 (fault image). The fault image is stored and in step S302 a first reconfiguration of the available redundant address lines (word and bit lines), which specifies which of the redundant word lines 214 to 218 and/or which of the redundant bit lines 220, 222 should replace fault-afflicted word or bit lines in the individual blocks 202 to 212, is selected by a redundancy analyzer.

In step S304 it is checked whether all the faulty memory cells in the regular region are replaced by this reconfiguration. If this is not the case, a new reconfiguration is specified in step S306 to replace the faulty memory cells and the method then returns to step S304. This loop forms the core of a traditional redundancy analysis method and it is traversed repeatedly until either complete fault coverage is achieved or a termination criterion for the loop is reached and the memory is rejected as being irreparable.

In the check made in step S304 it is assumed that the fault image itself has not been altered by the reconfiguration. This assumption is always fulfilled for traditional block formation (segmentation) according to FIG. 1. For a blockfree redundancy architecture according to FIG. 2, this assumption may prove to be invalid when redundant lines are themselves fault-afflicted. The prerequisite for successful implementation of traditional redundancy analysis methods in conjunction with blockfree redundancy therefore is the guarantee that the replacing rows/columns, i.e. the redundant word lines/bit lines themselves, are fault-free. In reality, however, this assumption will, with a finite probability, prove to be invalid. If faults occur in the redundant section of the memory cell field itself, i.e. if faulty memory cells are assigned to the redundant address lines, an apparent solution offered by a conventional redundancy analyzer may displace faults from the redundant region into the address region of the main cell field and leave them uncovered. This situation results after traversal of the method steps S300 to S304 described in FIG. 3.

To solve this problem, the prior art proposes that, for blockfree redundancy, use of the traditional redundancy analyzer is followed by examination of the emergent solution in respect of faults which have remained uncovered, which can be caused by "migrated" defects on redundant lines. This is represented in FIG. 3 by the step S308. If it is established in step S304 that all faults in the regular region have been replaced, it is established in step S308 whether faulty memory cells from the redundant region have migrated into the regular region. If this is not so, the reconfiguration is output as the solution in step S310. If it turns out that faults have remained uncovered, the memory element is rejected as being irreparable in step S312.

In an expanded method the steps S302 to S308 are regarded as the first solution stage and in a second solution stage it is determined whether the uncovered remaining faults can be covered by means of redundant address lines which have not yet been used. If this is possible, the solution, i.e. the reconfiguration of the memory, is extended accordingly. Otherwise the memory element is rejected as irreparable.

The known two-stage solution method described last is disadvantageous in that the first stage knows nothing of the criteria according to which the second stage operates, so that, in certain circumstances, components/memory elements which are actually reparable are rejected. The reason for this is that analyzer in the first stage can offer a solution which leads to the situation that no further redundant lines are available which would permit coverage of remaining faults on the redundant lines which have been used although an alternative solution would have been possible with which all faults could have been covered. It is desirable that the remaining, theoretically avoidable, yield loss should also be excluded in practice.

SUMMARY OF THE INVENTION

It is the object of the present invention to provide an improved method for reconfiguring a memory so as to improve the yield when manufacturing memory elements.

The present invention is a method for reconfiguring a memory so as to replace faulty memory cells in a plurality of blocks of the memory with redundant memory cells, where each block has a plurality of first and second regular address lines with assigned memory cells and a plurality of first and second redundant address lines with assigned memory cells through which the first and second regular address lines are replaceable, wherein the first redundant address lines of a block are utilizable in at least one other block of the memory, wherein faulty memory cells of the first redundant address lines displaced to another block are replaceable by second redundant address lines of the other block, and wherein the method comprises the following steps: a) determining a fault image; b) reconfiguring the memory, so as to replace faulty memory cells; c) determining whether the reconfiguration in step b) has resulted in at least one first redundant address line with faulty memory cells being displaced from one block to another block; d) if one or more first redundant address lines with faulty memory cells have been displaced from one block to another, assigning the displaced first redundant address lines with faulty memory cells to the other block; e) determining whether the fault image is covered by the reconfiguration taking account of the assignment in step d); and f) if the fault image is covered, outputting the reconfiguration as a valid solution.

The present invention is a method for reconfiguring a memory so as to replace faulty memory cells in a plurality of blocks of the memory with redundant memory cells, wherein each block has a plurality of first and second regular address lines with assigned memory cells and a plurality of first and second redundant address lines with assigned memory cells through which the first and second regular address lines are replaceable, wherein the first redundant address lines of a block are utilizable in at least one other block of the memory, where faulty memory cells of the first redundant address lines displaced to another block are replaceable by second redundant address lines of the other block, and wherein the method comprises the following steps: a) determining a fault image; b) determining whether first redundant address lines have one or more faulty memory cells assigned to them; c) if the first redundant address lines have faulty memory cells assigned to them, distributing and assigning the first redundant address lines with faulty memory cells to the plurality of blocks according to a specified rule; d) performing a redundancy analysis of the fault image, the first redundant address lines distributed in step c) being fixedly assigned to the blocks for this redundancy analysis; e) determining whether the fault image is covered; and f) if the fault image is covered, outputting a reconfiguration specified by the redundancy analysis as a valid solution.

Figure 3A:
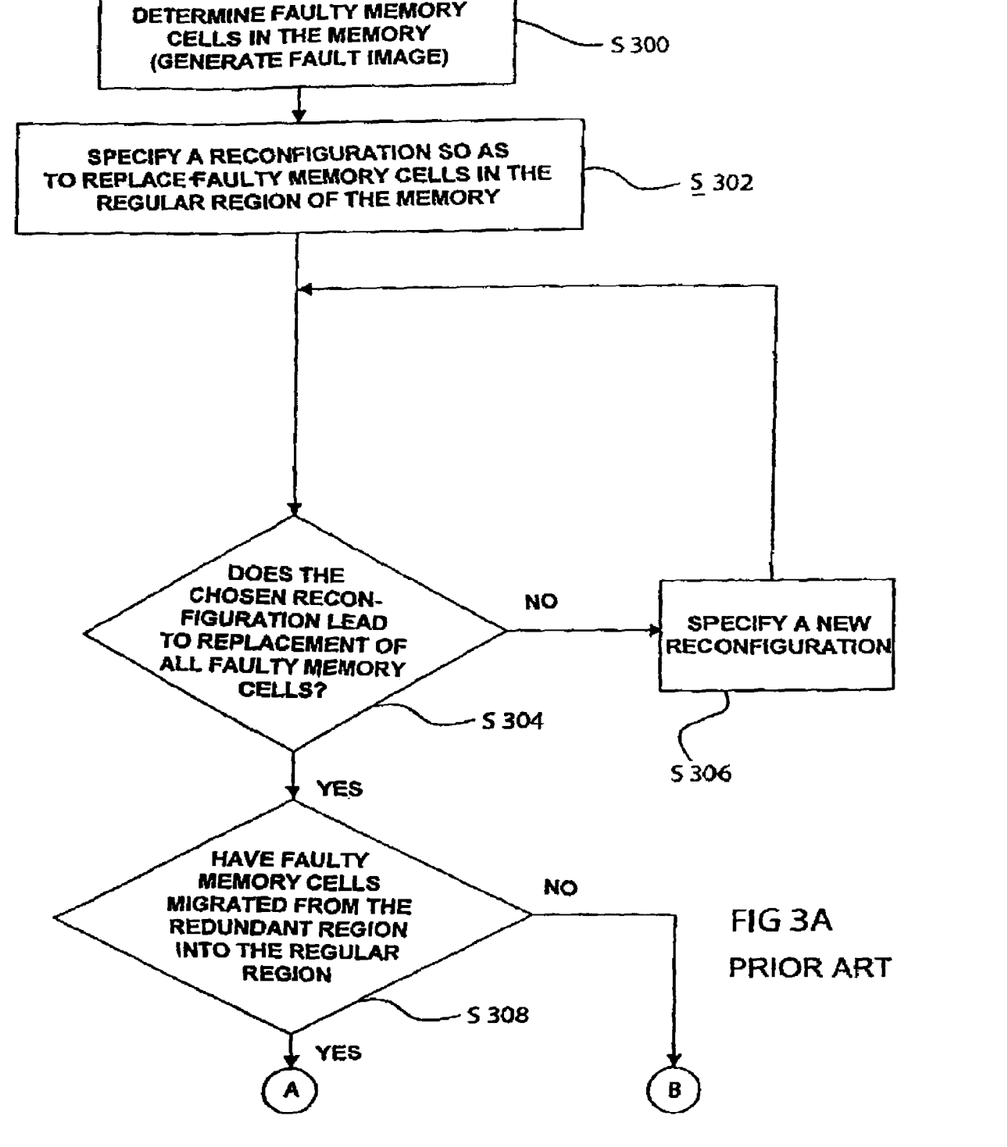
FIGS. 3A and 3B show a flowchart describing a known method for reconfiguring the memory cell field described in FIG. 2 so as to replace faulty memory cells.
Figure 3B:
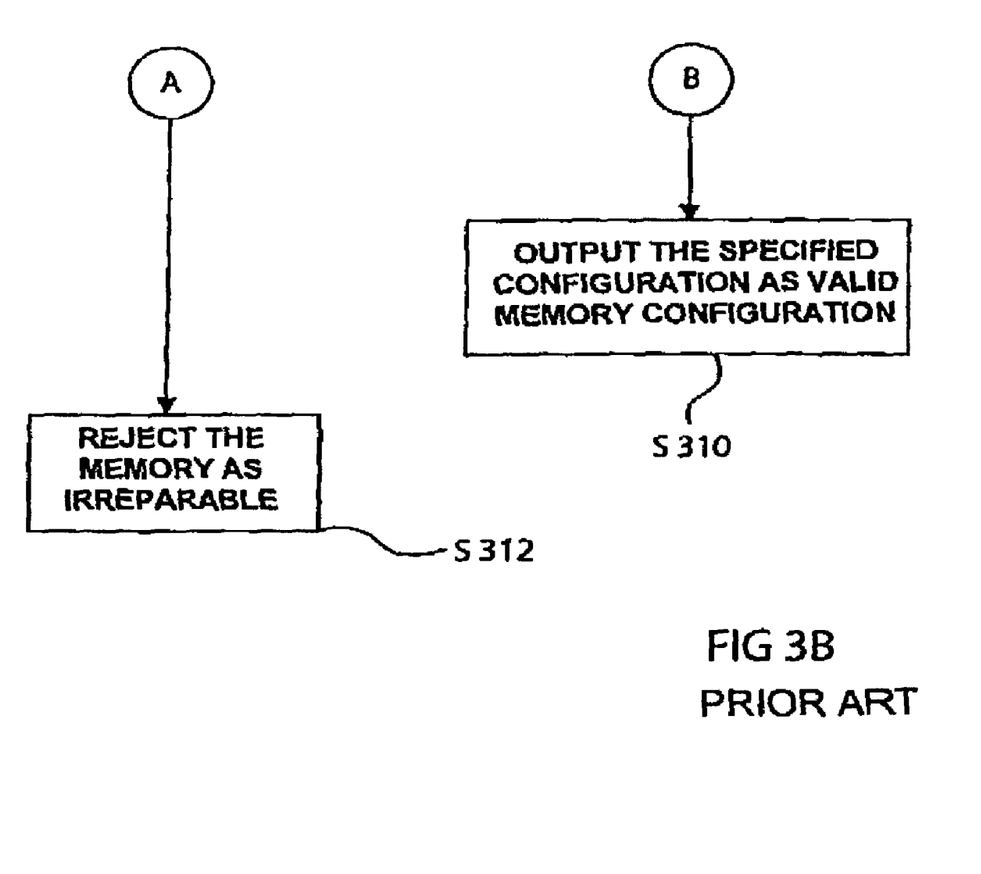

The present invention is based on the finding that a complete solution of the problem described in terms of FIG. 3, and thus an increase in the yield in the production of memory elements, e.g. DRAMs, can be achieved by replacing the two-stage analysis known in the prior art with an integrated analysis. This integrated analysis takes account of the special block formation of the blockfree redundancy architecture.

According to one embodiment, the steps c) to e) are repeated until a solution is obtained, so that the method according to the present invention is exhaustive, which means that it always leads to fault coverage, if such a thing exists, the search for a solution simply being performed subject to the restriction which is valid for all redundancy analyzers, that it must not take longer than a specified time and is terminated when this time is exceeded. Practical investigations have shown, however, that in realistic systems with sensibly chosen time barriers the incidence of the latter cases is negligibly small.

The memory comprises one or more regular (non-redundant) regions with a plurality of memory cells and redundant regions with a plurality of redundant memory cells, the regular regions having a plurality of address lines with assigned memory cells, and the redundant regions having a plurality of redundant address lines with assigned memory cells which can be assigned to the regular regions on a blockfree basis.

The advantage of the present invention is to be seen in the fact that, unlike in traditional methods, memories which are still repairable are not falsely classified as irreparable and rejected on the basis of the analysis method, so that a corresponding increase in yield can be achieved.

The present invention is applicable to any memory component with a matrix organization which is reconfigurable through row and column readdressing and which has block-free redundancy, e.g. to dynamic semiconductor memories.

For large memories with many redundant elements (e.g. for memories with 64 MB memory elements with about 4% redundant elements), efficient implementation of the method according to the present invention will depend on the programming of powerful computation processors.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 4A:
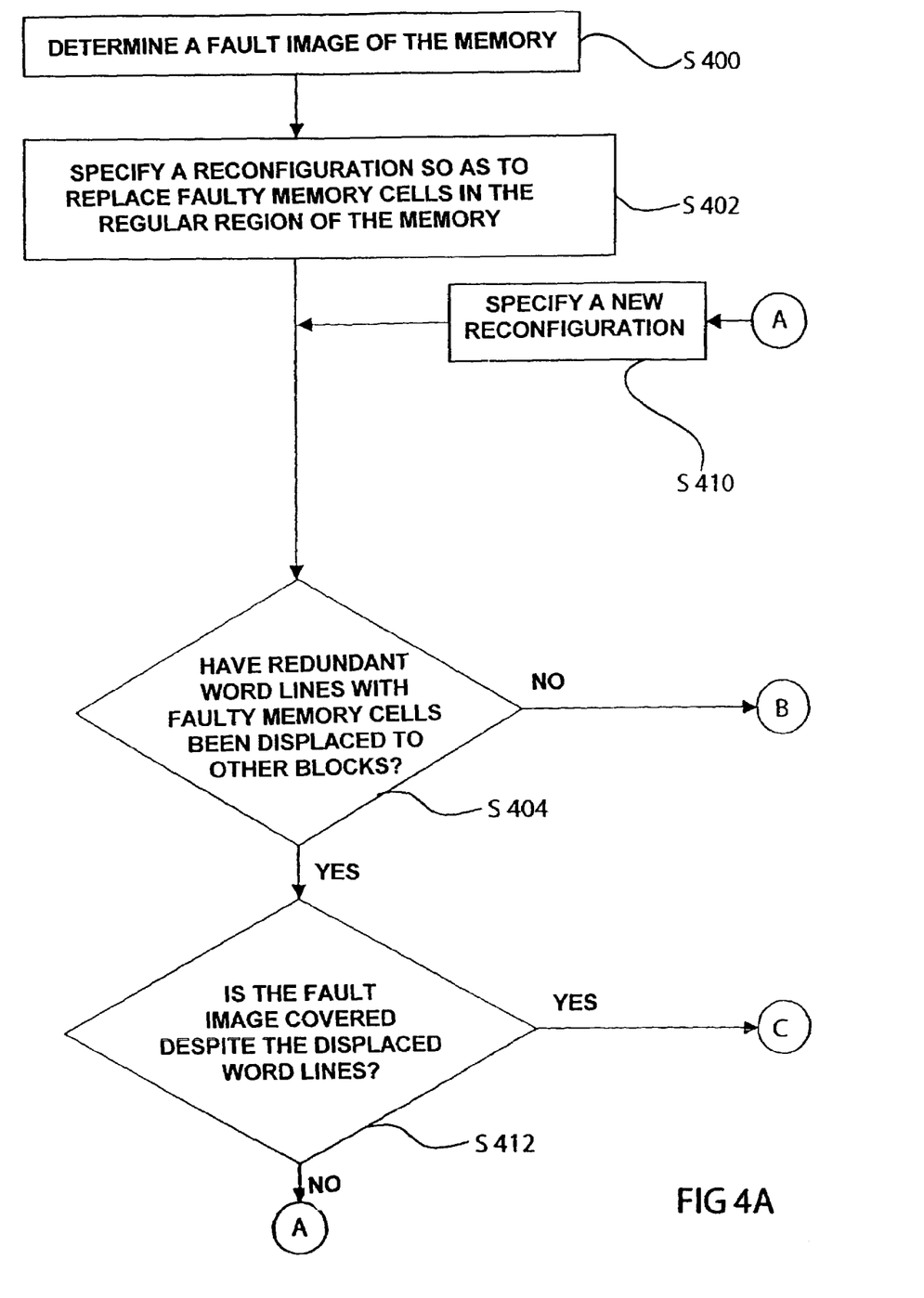
FIGS. 4A and 4B show a flowchart that describes the method according to the present invention for replacing faulty memory cells according to a first embodiment of the present invention.
Figure 4B:
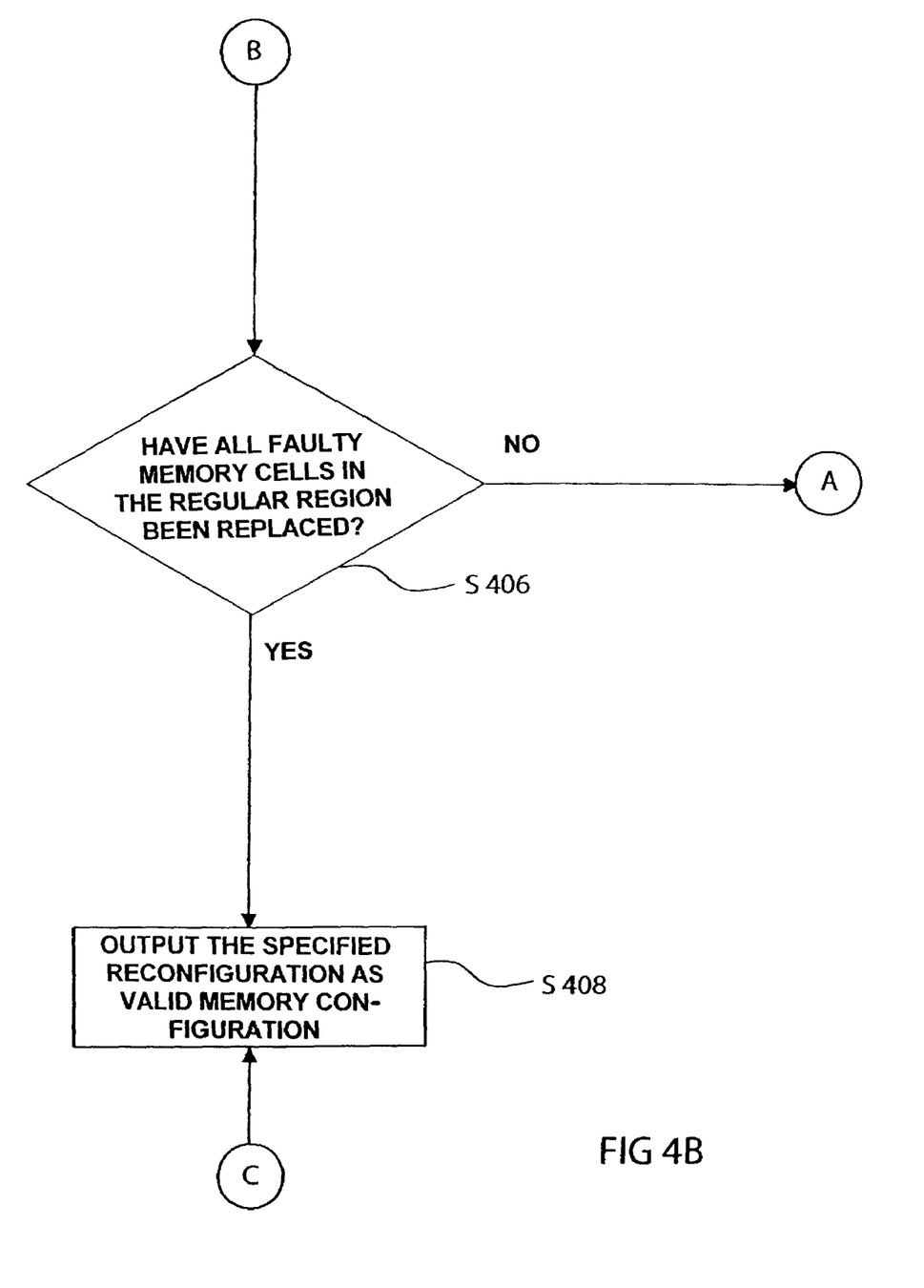
Figure 5A:
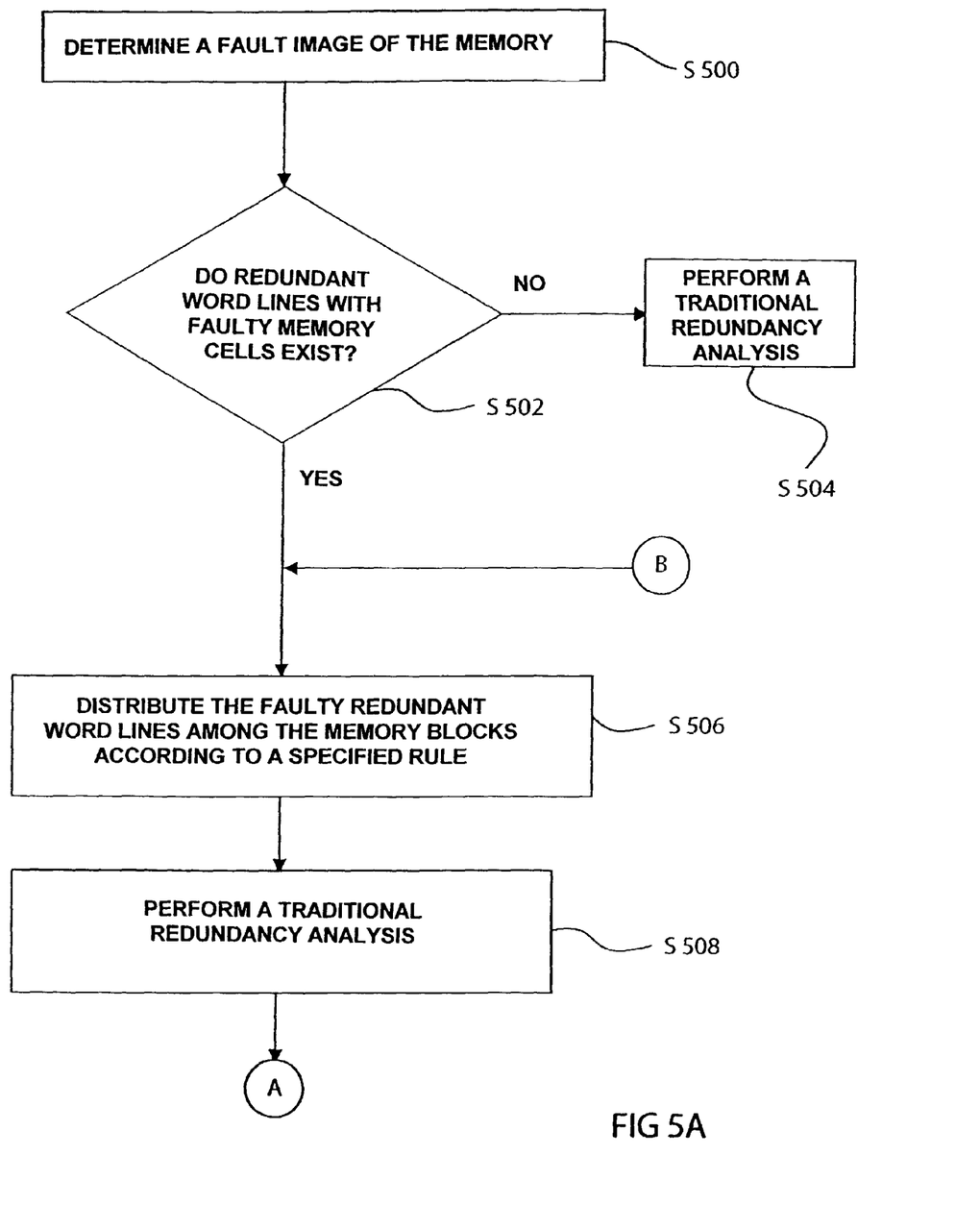
FIGS. 5A and 5B show a flowchart that describes the method according to the present invention for replacing faulty memory cells according to a second embodiment of the present invention.
Figure 5B:
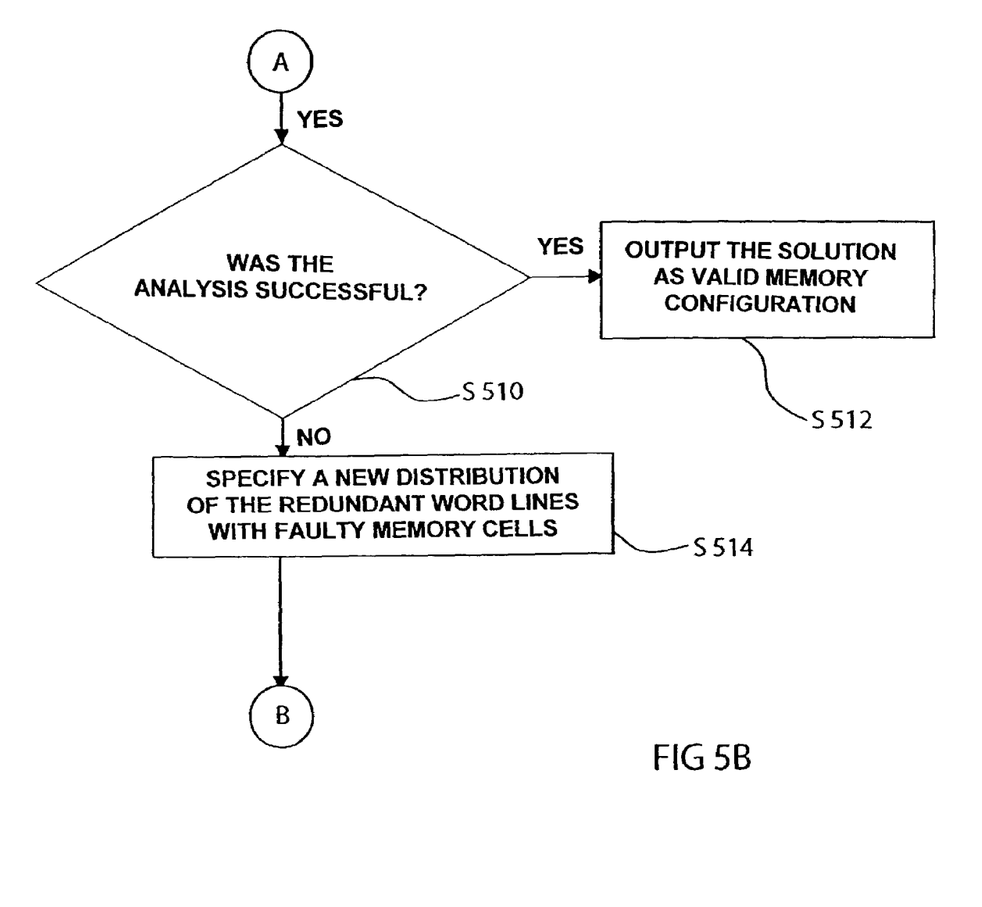

The method according to the present invention is explained in more detail below referring to FIGS. 4A, 4B, 5A and 5B. Later, a preferred embodiment of the present invention according to FIG. 5 is described with the help of FIG. 6. In the following description of the preferred embodiments of the present invention it is assumed that the memory has a plurality of blocks. Each block has a plurality of regular word lines and regular bit lines with assigned memory cells and a plurality of redundant word lines and redundant bit lines with assigned memory cells through which the regular word and bit lines can be replaced. The redundant word lines of a block are utilizable in at least one other memory block. Faulty memory cells of the redundant word lines displaced to another block are replaceable with redundant bit lines of the other block.

In a first step S400 a fault image of the memory under investigation is determined (regular and redundant regions), in a similar manner to the method described in relation to FIG. 3, in order to register faulty memory cells. If faulty memory cells are found in the regular regions of the memory, a reconfiguration is specified in step S402 to replace these faulty (fault-afflicted) memory cells in the regular region with non-faulty memory cells from the redundant region.

Subsequently in step S404 it is determined whether one or more redundant word lines with faulty memory cells have been displaced from the original blocks to other blocks by the preceding reconfiguration. If this is not the case, it is determined in step S406 (FIG. 4B) whether the fault image is covered by the reconfiguration, i.e. whether all the faulty memory cells in the regular region of the memory have been replaced with functional memory cells. If this is so, the method ends at step S408 with the output of the solution, the reconfiguration valid at the time, as the valid memory configuration.

Otherwise, i.e. if all the faulty memory cells in the regular region have not been replaced, the method proceeds to step S410 (FIG. 4A) in which a new reconfiguration is selected on the basis of which the faulty memory cells are to be replaced, and the method returns to step S404.

If it was established in step S404 that redundant word lines with faulty memory cells were displaced to other blocks, these displaced redundant word lines are assigned to the new blocks and it is established in step 412 whether the fault image is covered by the reconfiguration despite the displaced redundant word lines. If this is so, the method proceeds to step S408 (FIG. 4B) so as to output the reconfiguration as the valid memory configuration.

If it was established in step S412 that the fault image is not covered, the method returns to step S410 to specify a new configuration.

A second embodiment of the present invention is explained below making reference to FIGS. 5A and 5B. The starting point here is a memory which also formed the basis of the first embodiment described with reference to FIG. 4.

In a first step S500 a fault image of the memory under investigation is determined (regular and redundant regions) so as to register faulty memory cells, much in the way of the method described in relation to FIG. 4. If faulty memory cells are found in the regular regions of the memory, it is determined in step S502 whether redundant word lines exist to which faulty memory cells are assigned. If this is not so, a traditional redundancy analysis is performed in step S504 and the solution which is obtained is output.

If there are redundant word lines with faulty memory cells, they are distributed among the individual blocks of the memory according to a prescribed rule in a step S506. The distribution can take place ignoring all redundant word lines with faulty memory cells, it can be made depending on the number of redundant word lines with faulty memory cells, and/or the redundant word lines with faulty memory cells are distributed among the blocks depending on a probability with which a distribution leads to a solution.

Subsequently, in step S508 a traditional redundancy analysis is performed, the distributed redundant word lines being fixedly assigned for this redundancy analysis to the blocks among which they were distributed.

In step S510 (FIG. 5B) it is established whether this traditional redundancy analysis was successful. If this is the case, the method proceeds to step S512 to output the solution as a valid memory configuration. If it is found in step S510 that the traditional redundancy analysis has failed (no solution has been found for the distribution), a new distribution of the redundant word lines with faulty memory cells among the blocks is specified in step S514, and the method goes back to step S506.

Figure 6A:
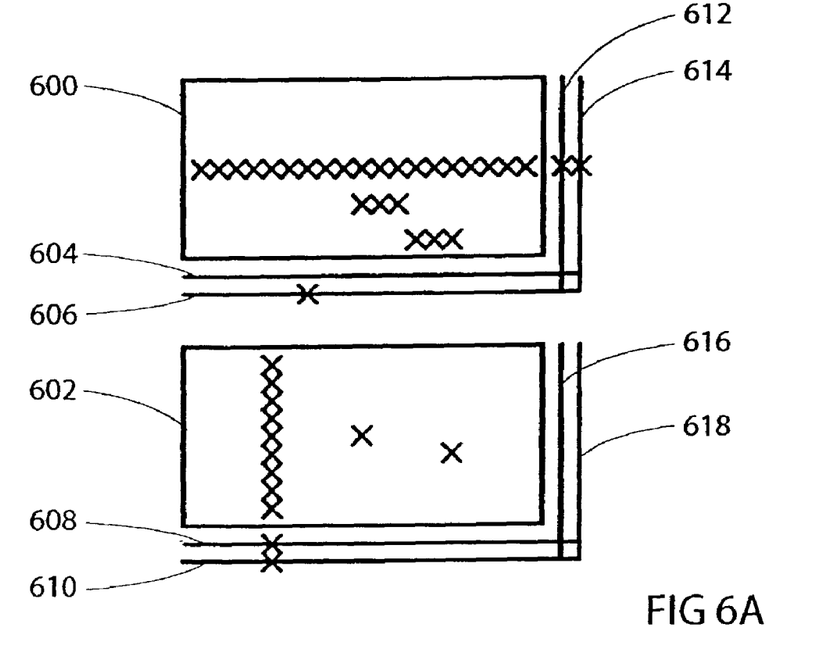
FIGS. 6A to 6F show a description of the individual method steps of the method according to the present invention according to the second embodiment from FIG. 5 in the light of an exemplary faulty memory configuration.

Making reference to FIG. 6 the embodiment described in terms of FIG. 5 will be explained in more detail, in particular the steps which, taking account of faulty memory cells which are assigned to the redundant word lines used, are necessary to determine whether it is or is not possible to replace all the faulty memory cells in the regular region of the memory cell field by means of a given distribution of the redundant word lines.

A concrete implementation of the method according to the present invention requires a very efficient choice among the theoretically possible reconfigurations, since even the most powerful processor, given today's usual memory sizes and redundancy architectures, would require an unacceptably long time searching blindly for the solution. An example with a blockfree row redundancy architecture and an embodiment of the present invention is considered more closely below with the help of FIG. 6. In this embodiment distributions of the redundant word lines for possible replacement are considered.

FIG. 6A, a section through a memory cell field, shows the original fault image. A memory cell field with a first block 600 and a second block 602 is shown in FIG. 6A, in which faulty memory cells are indicated schematically by the symbol "X". Two redundant word/row lines (word lines in what follows) 604 and 606 are assigned to the first block 600 and two redundant word lines 608 and 610 are assigned to the second block 602. In addition, two redundant bit/column lines (bit lines in what follows) 612 and 614 are assigned to the first block 600 and two redundant bit lines 616 and 618 are assigned to the second block 602.

In a first step it is first checked whether redundant word lines exist to which faulty memory cells are assigned, i.e. whether there are faults on redundant word lines. If it is established that none of the redundant word lines exhibits a fault, a traditional redundancy analysis method follows.

In the example described in FIG. 6A, however, it is established that the redundant bit lines 612 and 614 and the redundant word lines 606, 608 and 610 are faulty, i.e. that faulty memory cells are assigned to these redundant address lines, as is made clear in the diagrams by means of the symbol "X".

Figure 6B:
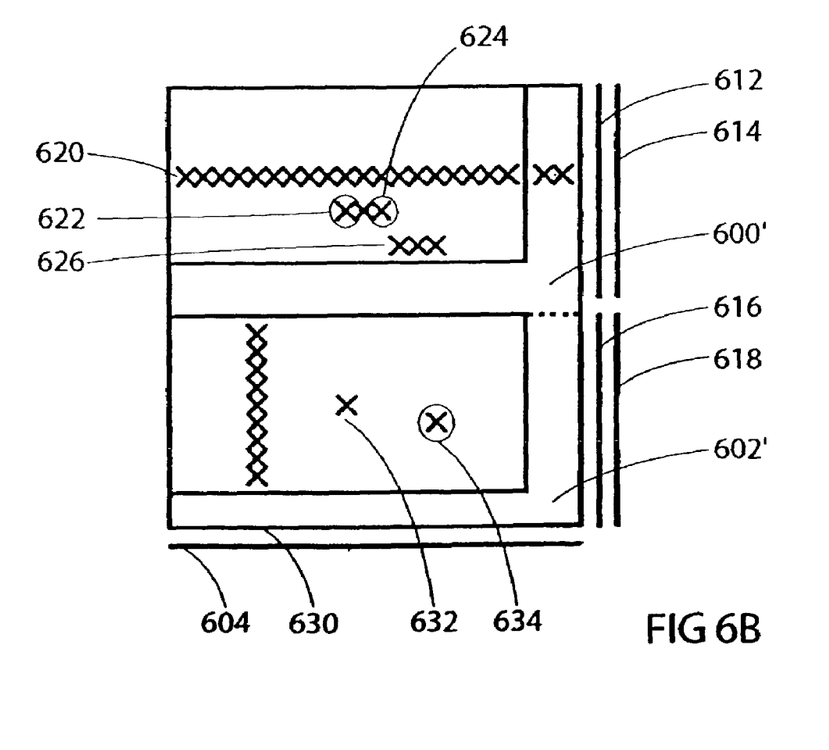

In a first solution step the redundant word lines with faults are ignored and an attempt is made to find a solution to the faulty memory configuration using the remaining redundant fault-free word line. This situation is shown in FIG. 6B, in which the fault-afflicted word lines 606, 608, 610 have been "blanked out" and only the fault-free redundant word line 604 and the redundant bit lines 612, 614, 616 and 618 remain. The bit lines 612 and 614, which in FIG. 6A were still shown with faulty memory cells, have been "logically" corrected in that the faulty memory cells have been assigned to an extended block 600'.

To correct the bit lines 612 and 614 the word line 604 is enlisted in FIG. 6B to replace the word line 620 in the first block 600, whereby the faulty memory cells assigned to the bit lines 612 and 614 in this line are replaced, so that the bit lines 612 and 614 can be enlisted to replace other faulty memory cells in the block 600.

It should be noted that the displacement of the individual address lines represented in FIG. 6 serves only to simplify the explanation of the method according to the present invention. In reality, there is no change in the physical layout of the memory cell field. Rather, the appropriate assignment of the redundant address lines, after finding a configuration which eliminates all faults, takes place on the basis of an appropriately generated data record in the light of traditional techniques.

The configuration shown in FIG. 6B, wherein the faulty redundant word lines have been ignored, does not lead to a solution since the remaining redundant word lines and bit lines do not provide the possibility of covering all faulty memory elements in the regular regions of the blocks.

The faulty row 620 in the first block 600 is thus replaced via the redundant word line 604, as already indicated, so that a part of the row 622 could be replaced via the bit lines 612 and 614. The faulty memory cell 624 in row 622 could no more be replaced, however, than the faulty memory cells in row 626. Similarly, in the second block 602 the fault-afflicted columns 630 and 632 could be replaced by means of the bit lines 616 and 618, replacement of the faulty memory cell 634 not being possible, however.

The solution attempt shown in FIG. 6B, namely ignoring the faulty redundant word lines and attempting to find a solution with the remaining fault-free word line enlisting the redundant bit lines, i.e. to cover all faulty memory elements, does not lead to success.

After the failure of the attempted solution shown in FIG. 6B, possible distributions of the faulty (defective) redundant word lines among the blocks 600, 602 are selected in subsequent steps.

For each selected distribution the redundant word lines with faults are distributed and a normal redundancy analysis is performed. If this is not successful, another distribution of the faulty or defective redundant word lines among the blocks is selected and a new redundancy analysis is performed, the process being repeated until a solution is found, which is then output as a valid memory configuration, or until it is established that all possible distributions have been tried and that the memory must be regarded as irreparable because of the high incidence of faults.

Figure 6C:
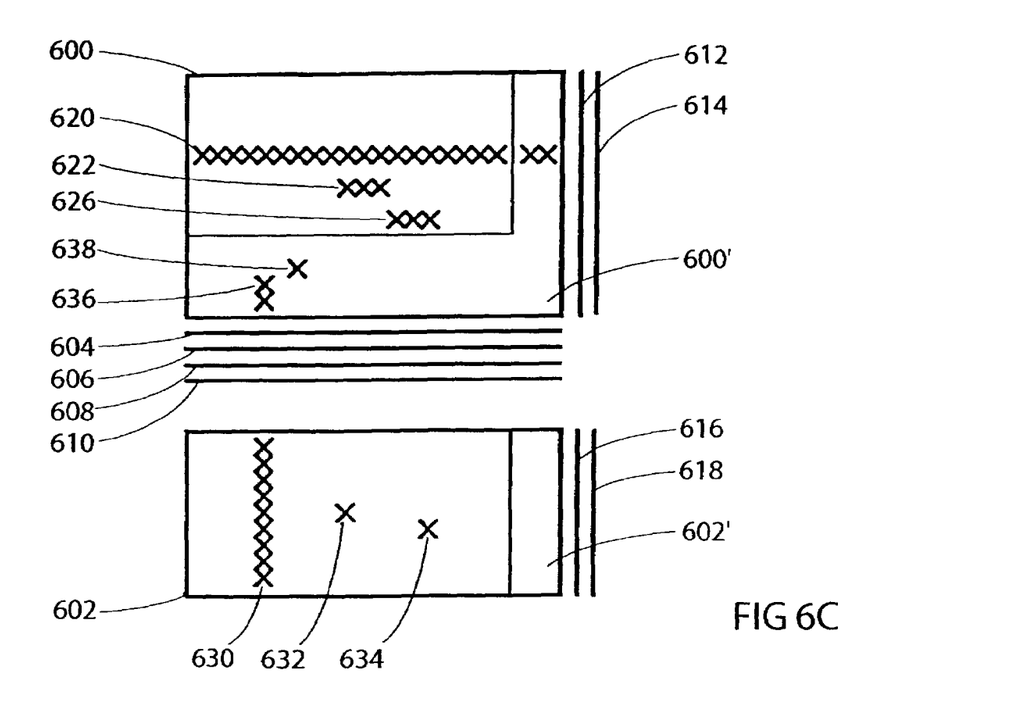

A first possible distribution of the defective redundant word lines 606 to 610 among the elementary word line segments is shown in FIG. 6C, this distribution being such that all faulty redundant word lines are assigned to the first block 600, i.e. this block is virtually enlarged (enlarged block 600').

To correct the bit lines 612 and 614 the word line 604 is enlisted in FIG. 6C, as in FIG. 6B, so as to replace the word line 620 in the first block 600, whereby the faulty memory cells in this row assigned to the bit lines 612 and 614 are also replaced, so that the bit lines 612 and 614 can be enlisted to replace other faulty memory cells in the block 600. The corrected, redundant bit lines 612 and 614 are enlisted so as to replace the columns 636 and 638 in the first block 600, whereby the faulty memory cells assigned to the redundant word lines 606, 608, 610 are replaced, so that these word lines can again be enlisted for a correction.

The distribution represented in FIG. 6C does not lead to a solution either, however, i.e. to replacement of all faulty memory cells. In block 600 a spanning of all faulty memory elements would be possible. Here the faulty row 620 is replaced by the redundant word line 604. The columns 636 and 638 are replaced by the redundant bit lines 612 and 614, whereby the word lines 606, 608 and 610 become available again, so that the rows 622 and 626 are replaced by the word lines 606 and 608, whereby all faulty memory cells in the first block 600 have been replaced. The word line 610 is not required. Consequently, a solution (reconfiguration) could be found for the block 600, such that all faulty memory cells in the regular region have been replaced. However, the described distribution provides no solution for the block 602, since only the bit lines 616 and 618 are here available for a readdressing, so that e.g. only the columns 630 and 632 can be replaced, the faulty memory cell 634, however, as already in FIG. 6B, remains behind as not replaceable.

Figure 6D:
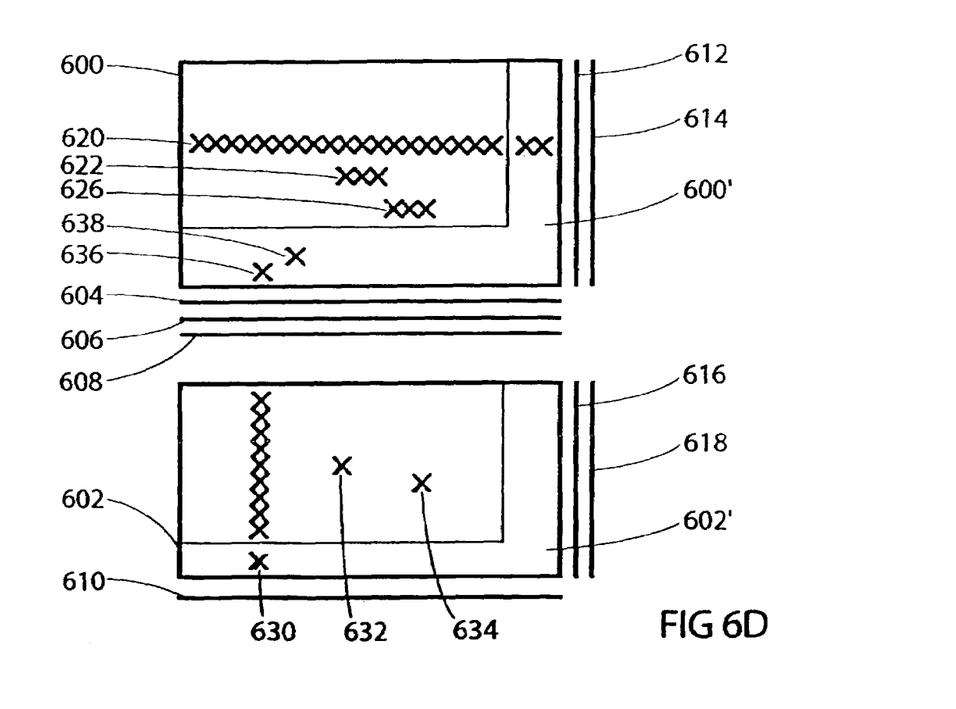

Since the distribution represented in FIG. 6C fails to provide a solution, some other distribution must be sought. A further distribution of the faulty word lines is shown in FIG. 6D, wherein two faulty redundant word lines 606, 608 are assigned to the block 600 (extended block 600') and one faulty redundant word line 610 is assigned to the block 602 (extended block 602'). As an be seen from FIG. 6D, the fault-free redundant word line 604 and the further fault-afflicted redundant word lines 606 and 608 are assigned to the first block 600. The fault-afflicted redundant word line 610 is assigned to the second block 602.

Similarly to the case in FIG. 6C, to correct the bit lines 612 and 614 the word line 604 is also enlisted in FIG. 6D so as to replace the word line 620 in the first block 600, whereby the faulty memory cells assigned to the bit lines 612 and 614 in this row are replaced, so that the bit lines 612 and 614 can be enlisted to replace other faulty memory cells in the block 600. The corrected redundant bit lines are enlisted to replace the columns 636 and 638 in the first block 600, whereby the faulty memory cells assigned to redundant word lines 606 and 608 are replaced, so that these word lines can be enlisted again for a correction. Likewise, in the second block 602 one of the bit lines 616 or 618 is enlisted to replace the column 630, whereby the faulty memory cell assigned to the redundant word line 610 is replaced, so that this word line can be enlisted again for a correction in the block 602.

It should be stressed once more here that once the word lines have been assigned to one of the blocks they can only be enlisted for a correction of faulty memory cells within this block. They can no longer be used beyond block boundaries.

The configuration shown in FIG. 6D leads to a solution, since all the faulty memory cells in the blocks 600 and 602 can here be replaced. More precisely, the faulty row 620 is replaced by the redundant word line 604, the faulty row 622 is replaced by the corrected redundant word line 606, and the faulty row 626 is replaced by the corrected redundant word line 608, so that all the faulty memory cells in the first block 600 are replaced by non-faulty memory cells.

All the faulty memory cells in the second block 602 can also be replaced. The faulty column 630 is replaced by the redundant bit line 616, the column 632 is replaced by the corrected redundant word line 610, and the hitherto non-replaceable memory cell 634 is replaced by the redundant bit line 618.

Consequently, all the faulty regular memory cells in the blocks 600 and 602 have been replaced by non-faulty memory cells. FIG. 6F shows this solution schematically, the sketched redundant word lines simply indicating that the rows/columns assigned to these access lines have been replaced by the relevant redundant word lines, so that all the faulty memory cells in the blocks 600, 600' and 602, 602' have been replaced by fault-free memory cells, i.e. the memory has been completely "repaired".

Figure 6E:
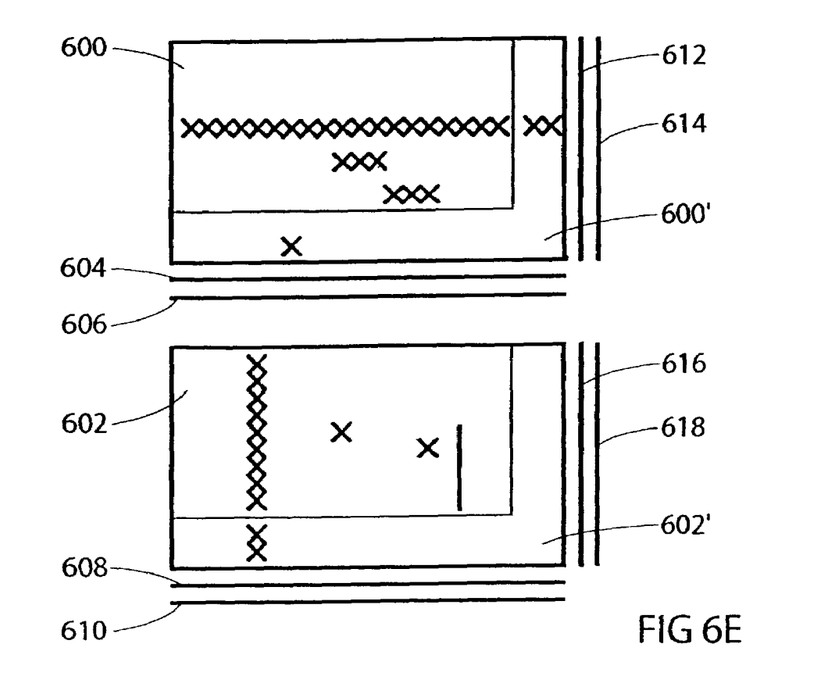
Figure 6F:
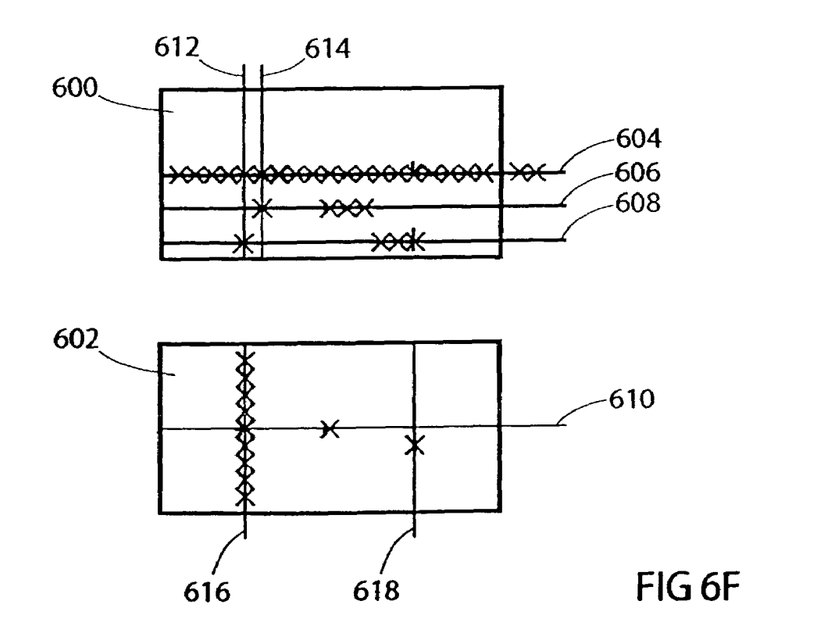

In addition to the possible distributions of the defective redundant word lines among the elementary word line segments 600 and 602 shown in FIGS. 6C and 6D, a third possible distribution is shown in FIG. 6E, where a faulty redundant word line 606 has been allocated to the first block 600 and two faulty redundant word lines 608, 610 have been allocated to the second block. The distribution represented in FIG. 6E does not lead to a solution, as can be inferred at once from the above discussion, and serves simply to clarify the different possibilities as to how the individual faulty redundant word lines can be distributed among the different blocks.

Although an embodiment has been described with the help of FIG. 6 wherein simply the faulty redundant word lines were distributed among the different blocks, the present invention is not restricted to this situation, since with other block configurations, e.g. contiguous blocks, it is possible to perform a distribution of redundant bit lines which corresponds analogously to that of the embodiment described with reference to FIG. 6. Furthermore, for a more extensive configuration of e.g. four blocks arranged in the form of a matrix, a combination can be enlisted wherein the faulty redundant word lines and also the faulty redundant bit lines can be distributed among different blocks during the analysis steps so as to find a solution.

| List of reference numerals | |
|---|---|
| 100 | matrix-shaped cell element |
| 102–112 | blocks |
| 114–122 | redundant address lines |
| 124–132 | block boundaries |
| 200 | matrix-shaped cell element |
| 202–212 | blocks |
| 214–222 | redundant address lines |
| 224, 226 | block boundaries |
| S300–S312 | method steps |
| S400–S412 | method steps |
| S500–S514 | method steps |
| 600 | first block |
| 600' | extended first block |
| 602 | second block |
| 602' | extended second block |
| 604–610 | redundant word line |
| 612–618 | redundant bit line |
| 620, 622 | row |
| 624 | faulty memory cell |
| 626 | row |
| 630, 632 | column |
| 634 | faulty memory cell |
| 636, 638 | column |

DRAWINGS

FIG. 3A, FIG. 3B:
S300 Determine faulty memory cells in the memory (generate fault image)
S302 Specify a reconfiguration so as to replace faulty memory cells in the regular region of the memory
S304 Does the chosen reconfiguration lead to replacement of all faulty memory cells?
S306 Specify a new reconfiguration
S308 Have faulty memory cells migrated from the redundant region into the regular region?
S310 Output the specified configuration as valid memory configuration
S312 Reject the memory as irreparable FIGS. 4A, 4B:
S400 Determine a fault image of the memory
S402 Specify a reconfiguration so as to replace faulty memory cells in the regular region of the memory
S404 Have redundant word lines with faulty memory cells been displaced to other blocks?
S406 Have all faulty memory cells in the regular region been replaced?
S408 Output the specified reconfiguration as valid memory configuration
S410 Specify a new reconfiguration
S412 Is the fault image covered despite the displaced word lines?

FIGS. 5A, 5B:
S500 Determine a fault image of the memory
S502 Do redundant word lines with faulty memory cells exist?
S504 Perform a traditional redundancy analysis
S506 Distribute the faulty redundant word lines among the memory blocks according to a specified rule
S508 Perform a traditional redundancy analysis
S510 Was the analysis successful?
S512 Output the solution as valid memory configuration
S514 Specify a new distribution of the redundant word lines with faulty memory cells

What is claimed is:

1. A method for reconfiguring a memory for replacing faulty memory cells in a plurality of blocks of the memory with redundant memory cells, each block having a plurality of first and second regular address lines with assigned memory cells and a plurality of first and second redundant address lines with assigned memory cells for replacing the first and second regular address lines, the first redundant address lines of a block being utilizable in at least one other block of the memory, faulty memory cells of the first redundant address lines displaced to another block being replaceable by second redundant address lines of the other block, the method comprising the following steps;
    a) determining a fault image;
    b) reconfiguring the memory, so as to replace faulty memory cells;
    c) determining whether the reconfiguration in step b) has resulted in at least one first redundant address line with faulty memory cells being displaced from one block to another block;
    d) if one or more first redundant address lines with faulty memory cells have been displaced from one block to another block, assigning the displaced first redundant address lines with faulty memory cells to the other block;
    e) determining whether the fault image is covered by the reconfiguration taking account of the assignment in step d);
    f) if the fault image is not covered, performing the steps b) to e) with a new configuration; and
    g) if the fault image is covered, outputting the reconfiguration as a valid solution.

2. The method according to claim 1, which further comprises the following steps after the step c):
    if no first redundant address lines with faulty memory cells have been displaced from one block to another block:
        (i) determining whether the fault image is covered by the reconfiguration;
        (ii) if the fault image is covered, outputting the reconfiguration as a valid solution; and
        (iii) if the fault image is not covered, repeating the steps b) to f) with a new reconfiguration.

3. The method according to claim 1, wherein the memory cells are arranged in the form of a matrix, wherein the first regular address lines are regular word lines and the second regular address lines are regular bit lines, and wherein the first redundant address lines are redundant word lines and the second redundant address lines are redundant bit lines, wherein the redundant word lines in column direction are utilizable beyond block boundaries, and wherein the redundant bit lines in row direction are utilizable beyond block boundaries.

4. A method for reconfiguring a memory for replacing faulty memory cells in a plurality of blocks of the memory with redundant memory cells, each block having a plurality of first and second regular address lines with assigned memory cells and a plurality of first and second redundant address lines with assigned memory cells for replacing the first and second regular address lines, the first redundant address lines of a block being utilizable in at least one other block of the memory, faulty memory cells of the first redundant address lines displaced to another block being replaceable by second redundant address lines of the other block, the method comprising the following steps:
    (a) determining a fault image;
    (b) determining whether first redundant address lines have one or more faulty memory cells assigned to them;
    (c) if the first redundant address lines have faulty memory cells assigned to them, distributing and assigning the first redundant address lines with faulty memory cells among the plurality of blocks according to a specified rule;
    (d) performing a redundancy analysis of the fault image, the first redundant address lines distributed in step (c) being fixedly assigned to the blocks for this redundancy analysis;
    (e) determining whether the fault image is covered;
    (f) if the fault image is not covered, repeating the steps (c) to (e) with a new distribution and assignment of the first redundant address lines with faulty memory cells among the plurality of blocks; and
    (g) if the fault image is covered, outputting a reconfiguration specified by the redundancy analysis as a valid solution.

5. The method according to claim 4, which further comprises the following steps after step (c):
    if the first redundant address lines have no faulty memory cells assigned to them:

(i) performing a redundancy analysis of the fault image;
(ii) determining whether the fault image is covered;
(iii) if the fault image is covered, outputting a reconfiguration specified by the redundancy analysis as a valid solution; and
(iv) if the fault image is not covered, repeating the steps (i) to (iv) with a new configuration.

6. The method according to claim 4, wherein the step (c) includes ignoring all the first redundant address lines with faulty memory cells.

7. The method according to claim 4, wherein in step (c) the distribution takes place depending on the number of first redundant address lines with faulty memory cells.

8. The method according to claim 4, wherein in step (c) the assignment of the first redundant address lines with faulty memory cells to the blocks takes place depending on the probability with which a distribution leads to a solution.

9. The method according to claims 4, wherein the memory cells are arranged in the form of a matrix, wherein the first regular address lines are regular word lines and the second regular address lines are regular bit lines, and wherein the first redundant address lines are redundant word lines and the second redundant address lines are redundant bit lines, wherein the redundant word lines in column direction are utilizable beyond block boundaries, and wherein the redundant bit lines in row direction are utilizable beyond block boundaries.

* * * * *